US007520416B2

(12) United States Patent
Crumbach et al.

(10) Patent No.: US 7,520,416 B2
(45) Date of Patent: Apr. 21, 2009

(54) TRANSPARENT WINDOW WITH NON-TRANSPARENT CONTACT SURFACE FOR A SOLDERING BONDING

(75) Inventors: Richard Crumbach, Aachen (DE); Bernhard Reul, Herzogenrath (DE); Andreas Sznerski, Baesweiler (DE)

(73) Assignee: Saint-Gobain Glass France, Courbevoie (FR)

(*) Notice: Subject to any disclaimer, the term of this patent is extended or adjusted under 35 U.S.C. 154(b) by 355 days.

(21) Appl. No.: 10/526,931

(22) PCT Filed: Oct. 15, 2003

(86) PCT No.: PCT/FR03/03034

§ 371 (c)(1), (2), (4) Date: Mar. 8, 2005

(87) PCT Pub. No.: WO2004/040944

PCT Pub. Date: May 13, 2004

(65) Prior Publication Data

US 2006/0126196 A1 Jun. 15, 2006

(30) Foreign Application Priority Data

Oct. 26, 2002 (DE) ................................ 102 49 992

(51) Int. Cl.
*B23K 31/02* (2006.01)
*H05B 3/16* (2006.01)

(52) U.S. Cl. ........................ 228/121; 219/543; 219/203

(58) Field of Classification Search ................. 228/121; 219/203, 202, 522, 543
See application file for complete search history.

(56) References Cited

U.S. PATENT DOCUMENTS 3,864,545 A * 2/1975 Schafer et al. .............. 219/203
3,895,218 A * 7/1975 Cooke ........................ 219/543
4,301,189 A 11/1981 Arai et al.
4,453,669 A * 6/1984 Karla et al. ............. 237/12.3 R
4,618,088 A * 10/1986 Karla ...................... 228/124.1
4,721,845 A * 1/1988 Kunert et al. ............... 219/203
4,997,396 A * 3/1991 Gold et al. .................. 439/801
5,011,745 A * 4/1991 Dietrich et al. ............. 428/630
5,099,621 A * 3/1992 Schacklette et al. ........ 52/171.3
5,299,726 A * 4/1994 Sauer ...................... 228/111.5
5,534,879 A * 7/1996 Braun et al. ................ 343/713
5,760,744 A * 6/1998 Sauer .................. 343/700 MS (Continued)

FOREIGN PATENT DOCUMENTS

DE 44 06 240 8/1995

(Continued)

*Primary Examiner*—Jessica L Ward
*Assistant Examiner*—Michael Aboagye
(74) *Attorney, Agent, or Firm*—Oblon, Spivak, McClelland, Maier & Neustadt, P.C.

(57) ABSTRACT

A transparent pane, in particular a glass pane, having at least one electroconducting, non-transparent contact surface placed on one of its surfaces, to connect it by soldering to a connection piece. In the region of the soldering location, the contact surface has at least one cutout via which the soldering filler metal is visible through the pane after the connection piece has been soldered to the contact surface. Such a configuration allows reliable visual verification of the soldering locations, even in cases in which the soldering location is incorporated within a composite glazing panel and has been soldered, if necessary by induction heating.

10 Claims, 1 Drawing Sheet

U.S. PATENT DOCUMENTS 5,898,407 A * 4/1999 Paulus et al. ................ 343/713
6,461,188 B2 * 10/2002 Reul .......................... 439/422
6,735,857 B2 * 5/2004 Saito et al. .................... 29/840

FOREIGN PATENT DOCUMENTS

DE 195 36 131 1/1997
DE 198 29 151 2/2000
EP 0 281 351 9/1988
EP 0 612 119 8/1994

* cited by examiner

TRANSPARENT WINDOW WITH NON-TRANSPARENT CONTACT SURFACE FOR A SOLDERING BONDING

BACKGROUND OF THE INVENTION

1. Field of the Invention

The invention relates to a transparent pane, in particular a glass pane, having at least one electroconducting, nontransparent contact surface placed on one of its surfaces, in order to connect it by soldering to a connection piece.

2. Description of Related Art

Such panes are known in many constructions. In most applications, the panes carry, on their surface, electrical functional elements such as electrically conducting tracks, heating surfaces, or antennas, again in the form of coatings over the entire surface, which have to be connected with at least one contact surface to an external connection piece by soldering.

Often the contact surfaces (for example, the conducting tracks or, depending on the case, the functional elements themselves) are produced by applying an electrically conducting paste to be baked; sometimes, thin strips of tinned metal foil are also used, these being connected by soldering to the surface of the pane, which is pretinned where appropriate. In all these cases, a connection piece is applied to the contact surface via the free side and is then soldered.

Many methods of producing composite glazing panels are also known that incorporate electrical functional elements between their rigid panes and are provided, near the edge of the composite glazing panel, with electrical connection pieces to be soldered of the type indicated at the beginning, and of course connection pieces, if possible flat pieces, are used in this case, these having, for example, the structure described in document DE-C2 19 536 131. It has also already been proposed (DE-C1 19 829 151) to supply the heat needed for the soft soldering by induction or laser beam only after a precomposite has been produced. The term "soft soldering" is understood to mean the use of a filler metal for soldering that has a low melting point, one that does not exceed a temperature of 450° C.

As a general rule, the connection pieces to be soldered or the soldering locations themselves are optically masked by means of opaque colored layers. In most standard cases of use as a vehicle window pane, the panes are almost always provided with a peripheral border band in the form of a frame made of a black screen-printing paste that is perfectly suitable for also masking the regions of electrical connections. Said collector rails or actual contact surfaces are also not transparent because they are made of a screen-printing paste with a high silver content or, as was indicated, in the form of bands of metal foil. On the passenger compartment side of the vehicle, the border regions of the panes and the mounting flanges on the body that bear them are usually covered and masked by interior furnishing elements.

In general, for transparent panes provided with contact surfaces, in particular for the soldering places located on the inside of a composite glazing panel, which are heated only after this composite has been manufactured, the problem arises of being able to reliably check the result of the soldering through the pane.

Although document EP-B1-281 351 describes one particular illustrative example of such soldering locations, in which a framed contact surface is produced on an opaque coating of the surface of a glass pane using a special screen-printing pattern on the structure of which the liquid soldering filler metal can adhere better, visual inspection of these soldering places is possible only from the free side of the pane; because of the opaque coating, the rear side of the contact surface is not visible through the actual pane.

The problem at the basis of the invention consists in proposing a solution to the abovementioned problem.

SUMMARY OF THE INVENTION

According to the invention, this problem is solved in that, in the region of the soldering location, the contact surface has at least one cutout via which the soldering filler metal is visible through the pane after the connection piece has been soldered to the contact surface. The features of the dependent claims provide this subject matter with advantageous developments.

Owing to the fact that at least one observation window is formed in the actual contact surface, which window remains visible through the transparent pane provided with the contact surface after the locations of the connection pieces have been soldered, it is possible to see, by simple visual verification, whether the soldering filler metal has melted and to what extent. Overall, the amount of soldering filler metal and the soldering location will be determined so that, in the event of correct soldering, part of the soldering filler metal flows so as to be optically visible in said observation window, or, depending on the case, so as to make the modification resulting from the melting of the surface structure of the soldering filler metal visible. In this way, the soldering filler metal after soldering being spread out over the contact surface and possibly in the cutout or cutouts, the visual inspection may even be, where appropriate, automated by means of digital cameras. The pane itself remains unaffected.

A cutout, for example, a hole 3 to 5 mm in diameter in the contact surface, is sufficient to leave the tinned surface of the connection piece visible. The trained eye of a verifier or a suitable optical monitoring device detects whether complete soldering has taken place. It is obvious that, should the need arise, several of these cutouts may be provided beside one another and may be arranged where appropriate in a predetermined pattern.

If the contact surface is applied by screen printing, it will be advantageous to provide, in the screen-printing screen, at the place of the location or locations in question, an appropriate mask that prevents application of the screen-printing paste in the region of the cutout. If the contact surface is formed by a band of metal foil, the cutout may be cut out or stamped by suitable tools at the intended point.

For reliable soldering, it is possible to provide, on the one hand, several small deposits of soldering filler metal (in the form of drops or in the form of a thin layer) on the corresponding contact surface of the connection part to be soldered. After the soldering operation, a check may be made by observing directly through said cutout made in the soldering region of the contact surface whether these deposits of soldering filler metal have melted and coalesced.

If, in order to minimize the total thickness of the connection region (in particular when it has to be incorporated into a composite glazing panel), regular pretinning of the corresponding contact surface (the connection piece) with a thin layer of soldering filler metal is preferred, then at least the structure of the tinned surface is modified as a result of the melting. In this case too, the soldering may be inspected optically through the said cutout. Such a deposit of soldering filler metal in the form of a layer is produced with a thickness of a few microns (10 to 15 μm).

It is also possible to furthermore deposit coatings of soldering filler metal, in the form of a thin layer of metal or in the form of droplets, on the contact surface itself, preferably around the cutout or cutouts.

As another advantage of said cutout or cutouts in the soldering region of the contact surface, it has been found that a higher mechanical strength is also provided at the location of the actual soldering, in such a way that the connection piece can withstand higher tensile forces. This is an advantage when continuing to handle such a pane, while it is being transported and fitted, because it is rare for connection pieces to be soldered, that have been inadvertently broken, to be able to be repaired or, depending on the case, the pane in question must be extracted from the series.

Where appropriate, and as described in the abovementioned document DE-C2-19 536 131, it is possible to provide several contact surfaces electrically separated from one another and placed beside one another, each of which will be provided with at least one cutout (for inspection).

It is obvious that panes thus equipped are not just suitable as vehicle window panes. In the building field, there also exist many applications for panes provided with electrical functional elements that have to be provided with soldered contacts (for example, glazing fitted with an alarm, surface heating, etc.).

BRIEF DESCRIPTION OF THE DRAWINGS

Other details and advantages of the subject of the invention will become apparent from the figures of an illustrative example and from its detailed description that follows.

In the figures, which have been simplified and not drawn to scale.

DETAILED DESCRIPTION OF PREFERRED EMBODIMENTS

Figure 1:
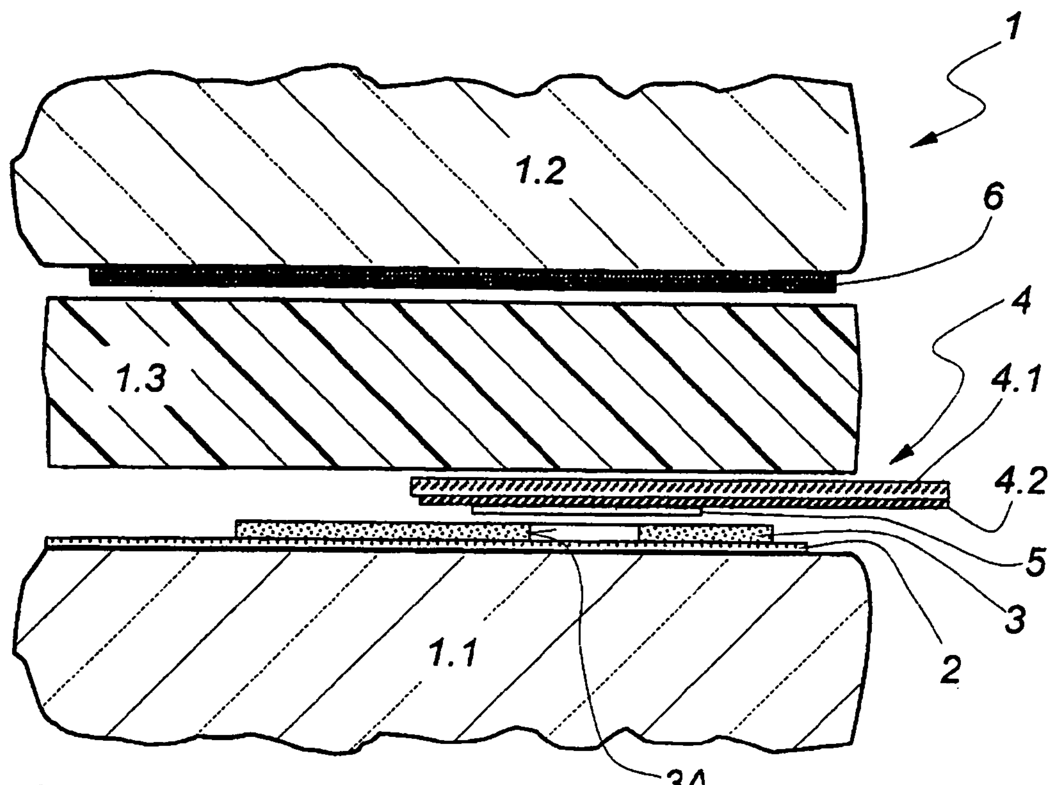
FIG. 1 shows a schematic cross section through the components of a composite glazing panel provided with a contact surface having a cutout and a connection piece to be soldered before the composite panel is assembled.

FIG. 1 shows an exploded representation of the border region of a composite glazing panel 1, essentially formed from a first rigid pane 1.1, a second rigid pane 1.2 and a thermoplastic and adhesive interlayer 1.3. The two rigid panes are preferably made of glass, but they may, however, also be made of synthetic material. The interlayer is, for example, a sheet of polyvinyl butyral—the usual adhesive material for composite glazing panels.

A thin-film system 2, highly transparent for visible light and capable of being thermally stressed, is applied to that plane surface of the rigid pane 1.1 which faces the interlayer. It comprises at least one electrically conducting functional layer, preferably made of metal, and antireflection layers that contain, between them, said functional layer. The more detailed structure of the multilayer system is not essential as regards the invention in question here, so that it will not be explained further.

Moreover, in addition to its thermal insulation action, or, depending on the case IR reflection action, the electrically conducting layer of the multilayer system 2 will also be used in a manner known per se as a heating layer. Where appropriate, an antenna function may also be added thereto. For this purpose, several external contacts have to be produced.

We will now describe the structure of an individual connection piece. In the multilayer system 2, near the edge of the first rigid pane 1.1, a contact surface 3 is formed in a known manner from an electrically conducting and nontransparent paste to be baked. It is interrupted by a cutout 3A which, according to the invention, forms an observation window in the middle of the contact surface 3.

The electrically conducting material of the contact surface 3 provides an electrically conducting connection with the electrically conducting layer of the multilayer system 2. This connection is formed, for example, by heating the pane 1.1 up to its softening temperature (about 650° C.), where appropriate bending it, after having applied the multilayer system 2 and having printed the contact surface 3, and then by leaving the pane to cool down. During this baking operation, the necessary electrical contact is produced.

Experiments have shown that, in particular in other configurations of the multilayer system and/or of the contact surface material, it is possible to use substantially lower temperatures, for example the temperature for drying the screen-printing paste, of about 180° C., to produce the electrical contact. This is a temperature range that is quite able to be withstood, for example, even by certain synthetic materials from which the transparent pane may be produced.

Unlike what has been shown, the multilayer system could also, again in a manner known per se, be applied only after application of the contact surface; in this case, the multilayer system would cover the contact surface in addition to the cutout. Electrical contacting is then also ensured because the micro-irregularities in the contact surface pass through the extremely thin multilayer system (thickness in the nanometer range).

In general, the conductor structure shown here as a contact surface 3 is usually a rail, called a collector, that extends parallel to the edge of the pane 1.1 and practically over its entire length, and which makes it possible for a current to be supplied into the layer 2 or, as the case may be, extracted regularly therefrom. Depending on the function, several connection pieces to be soldered may also be provided on such a collector rail.

Above the cutout 3A is the end of a connection piece 4 to be soldered, which must be extended laterally outside the composite and which in this case is configured as a flat conductor with a support sheet 4.1 made of synthetic material and, at least, a metal foil conductor 4.2. A thin layer 5 of soft solder filler metal is applied locally to the latter, within the limits of the actual soldering region. It forms the deposit of soldering filler metal for soldering the connection piece 4 to be soldered to the contact surface 3. As a general rule, the size of the surface to be soldered is between 100 and 400 $mm^2$. This also allows relatively high heater currents to be safely transferred.

Finally, an opaque border band 6 made of nontransparent paste to be baked is formed on that side of the surface of the other rigid pane 1.2 facing the interlayer 1.3. When the composite glazing panel is in its final state (FIG. 2), it optically masks a soldering location, or depending on the case the contact surface 3, to the outside.

Figure 2:
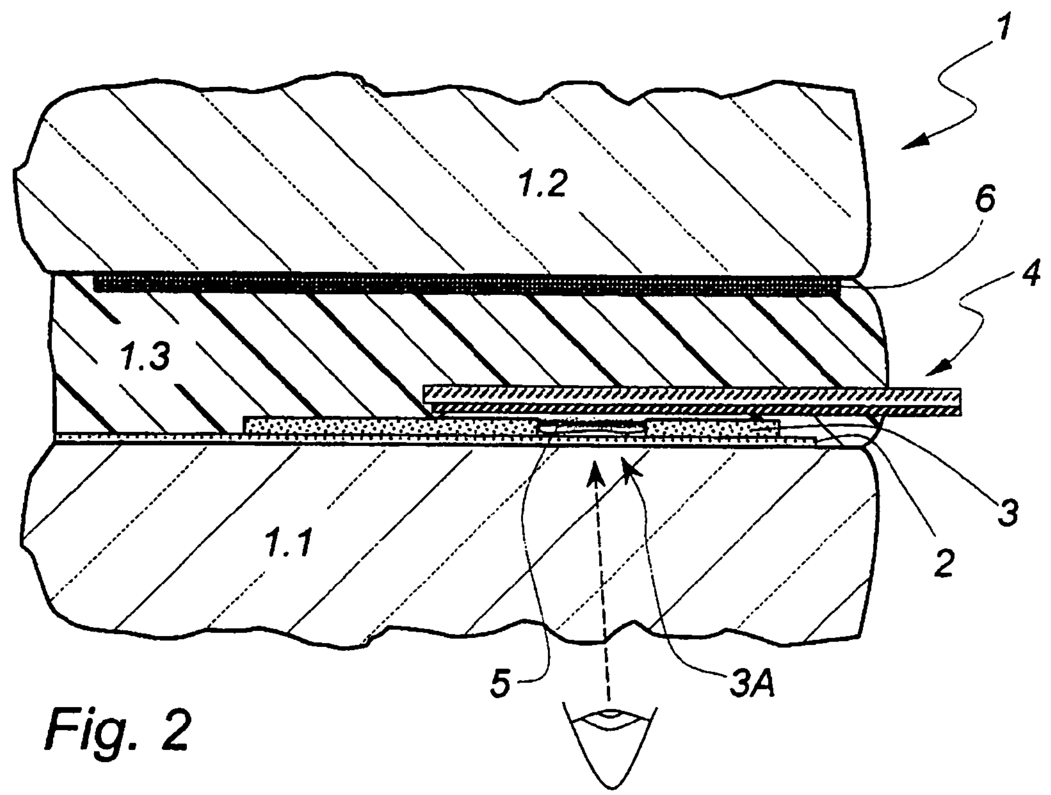
FIG. 2 shows, in cross section, the composite glazing panel after assembly and the soldering of the location of the connection piece.

FIG. 2 is a sectional view of the components shown in FIG. 1 after assembly and connection of the layers or, depending on the case, the panes of the composite glazing panel 1 and the production of the connection piece to be soldered. It may also be seen that the melting and the compression of the interlayer 1.3 along the edge of the pane seal the surfaces located further toward the inside. The connection piece 4 to be soldered extends toward the outside from the soldering location and is surrounded on all sides in an impermeable manner by the material of the interlayer. If necessary, the region located between the underside of the connection piece 4 to be soldered and the surface of the pane may also be sealed using an appropriate sealant and/or adhesive. It will be recalled here that highly simplified representation has been chosen.

It may be seen, in cross section, that the soft solder filler metal of the thin layer 5 has melted, for example by induction heating, and that, by the pressure that acts inside the composite glazing panel, it has flowed right into the cutout 3A. The soldering filler metal must in this case not come into contact with the surface of the multilayer system 2. The amount of soldering filler metal of the soldering filler metal deposit will be determined in such a way that the desired soldering area is obtained in a precise and reliable manner. This result of the soldering, namely the modification of the soldering filler metal layer, can be detected without any problem with the naked eye through the pane 1.1 and, as indicated, because the rigid pane 1.1 and the multilayer system 2 are transparent. Contact between a soldering filler metal and the side walls of the cutout result at the same time in major adhesion of the soldering filler metal to the material of the contact surface.

Although the embodiment described above can be used particularly advantageously on composite glazing panels that have the configuration indicated, it is not excluded to provide a cutout of the type and with the functions that have been explained here also in contact surfaces to be soldered on the monolithic panes.

The invention claimed is:

1. A transparent pane comprising:

at least one electroconducting, non-transparent contact surface placed on a surface of the pane, to connect it by soldering to a connection piece, the contact surface including at least one cutout, wherein, in a region of the soldering location, the at least one cutout of the contact surface is configured to be at least partially filled with a soldering filler metal, the filler being visible through the pane after the connection piece has been soldered to the contact surface.

2. The pane as claimed in claim 1, wherein, on the surface of the pane, plural contact surfaces and/or plural cutouts are provided in each contact surface.

3. The pane as claimed in claim 1, wherein the soldering filler metal, after soldering, is spread over the contact surface, and in the at least one cutout.

4. The pane as claimed in claim 1, wherein the connection piece is provided, before soldering, with deposits of soldering filler metal that are present in a form of droplets or of a thin layer.

5. The pane as claimed in claim 1, wherein the contact surface is provided, before soldering, around the at least one cutout, with deposits of soldering filler metal that are present in a form of droplets or of a thin layer.

6. The pane as claimed in claim 1, wherein a thin-film system transparent to visible light is applied between the surface of the pane and the contact surface or on top of the contact surface provided with the cutout, which thin-film system includes at least one electrically conducting layer that is connected in an electrically conducting manner to the contact surface.

7. The pane as claimed in claim 6, wherein the thin-film system is used as a surface heater and has an electrical contact.

8. The pane as claimed in claim 6, wherein the thin-film system is used as an antenna and has an electrical contact.

9. The pane as claimed in claim 1, incorporated as a rigid pane in a composite glazing panel, at least the contact surface and the soldering location both being located on an inside of the composite glazing panel.

10. A composite glazing panel having a first rigid pane as claimed in claim 1, and at least a second rigid pane, wherein the second rigid pane is provided with an opaque coating that covers the contact surface and optically masks the contact surface.

* * * * *